(12) United States Patent
Barel et al.

(10) Patent No.: US 11,404,494 B1
(45) Date of Patent: Aug. 2, 2022

(54) SENSING AMBIENT LIGHT FROM BEHIND OLED DISPLAY

(71) Applicant: Microsoft Technology Licensing, LLC, Redmond, WA (US)

(72) Inventors: Eliyahu Barel, Rosh-HaAyin (IL); Eran Arbel, Netanya (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/171,903

(22) Filed: Feb. 9, 2021

(51) Int. Cl.
*G09G 3/32* (2016.01)
*G09G 3/34* (2006.01)
*H01L 27/32* (2006.01)
*G09G 3/3208* (2016.01)
*G09G 3/3233* (2016.01)

(52) U.S. Cl.
CPC ....... *H01L 27/3227* (2013.01); *G09G 3/3208* (2013.01); *G09G 3/3233* (2013.01); *G09G 3/3413* (2013.01); *H01L 27/323* (2013.01); *G09G 2320/0626* (2013.01); *G09G 2360/144* (2013.01)

(58) Field of Classification Search
CPC .. G09G 3/3208; G09G 3/3233; G09G 3/3413; G09G 2320/0626; G09G 2360/144; H01L 27/323; H01L 27/3227
See application file for complete search history.

(56) References Cited

U.S. PATENT DOCUMENTS

| | | | |
|---|---|---|---|
| 7,825,891 B2 | 11/2010 | Yao et al. | |
| 8,749,538 B2 * | 6/2014 | Webster | G09G 3/3466 345/207 |
| 9,024,530 B2 | 5/2015 | Land et al. | |
| 9,620,571 B2 | 4/2017 | Shedletsky et al. | |
| 9,622,326 B1 | 4/2017 | Devyver et al. | |
| 10,249,262 B2 * | 4/2019 | Yang | G09G 5/10 |

(Continued)

FOREIGN PATENT DOCUMENTS

| | | |
|---|---|---|
| WO | 2020025612 A1 | 2/2020 |
| WO | 2020030786 A1 | 2/2020 |

OTHER PUBLICATIONS

"Ams' behind-OLED sensor could increase smartphone screen size", Retrieved from: https://www.electrooptics.com/news/ams-behind-oled-sensor-could-increase-smartphone-screen-size, Jan. 14, 2019, 6 Pages.

(Continued)

*Primary Examiner* — Vijay Shankar
(74) *Attorney, Agent, or Firm* — Alleman Hall Creasman & Tuttle LLP

(57) ABSTRACT

One example provides a method enacted on a display device comprising an organic light emitting diode (OLED) display panel and a light sensor positioned behind the OLED display panel with respect to a viewing surface of the OLED display panel. The method comprises receiving data samples from the light sensor and determining a temporal location for each of one or more non-emissive states of the OLED display panel. The method further comprises determining an ambient light characteristic using one or more data samples acquired during the one or more non-emissive states of the OLED display panel and adjusting an emission characteristic of the OLED display panel based at least in part on the ambient light characteristic determined.

18 Claims, 6 Drawing Sheets

(56) References Cited

U.S. PATENT DOCUMENTS

| | | | |
|---|---|---|---|
| 10,446,800 | B2 | 10/2019 | Shedletsky et al. |
| 10,453,371 | B2 * | 10/2019 | Perdices-Gonzalez ............... G09G 3/32 |
| 10,707,351 | B2 | 7/2020 | Kang et al. |
| 2012/0098870 | A1 | 4/2012 | Barnhoefer et al. |
| 2012/0274596 | A1 | 11/2012 | Ludwig |
| 2017/0301288 | A1 * | 10/2017 | Perdices-Gonzalez ............... G09G 3/2092 |
| 2018/0212060 | A1 | 7/2018 | Kang et al. |
| 2020/0004378 | A1 | 1/2020 | Liang et al. |

OTHER PUBLICATIONS

"Arns Introduces World's First Ambient Light, Proximity and Flicker Sensing Module Optimized for 'Behind OLED' Display Operation for Bezel-less Smartphones", Retrieved from: https://www.businesswire.com/news/home/20200916005363/en/ams-Introduces-World's-First-Ambient-Light-Proximity-and-Flicker-Sensing-Module-Optimized-for-'Behind-OLED'-Display-Operation-for-Bezel-less-Smartphones, Sep. 16, 2020, 3 Pages.

Khatiwada, Bivek, "Here's how your smartphone's display is affecting your health", Retrieved from: https://www.gadgetbytenepal.com/dc-dimming-pwm-dimming-explained/, May 23, 2019, 4 Pages.

Svilainis, Linas, "LED PWM dimming linearity investigation", In Journal of Displays, vol. 29, Issue 3, Jul. 1, 2008, 11 Pages.

"International Search Report and Written Opinion Issued in PCT Application No. PCT/US22/013078", dated Mar. 23, 2022, 20 pages.

* cited by examiner

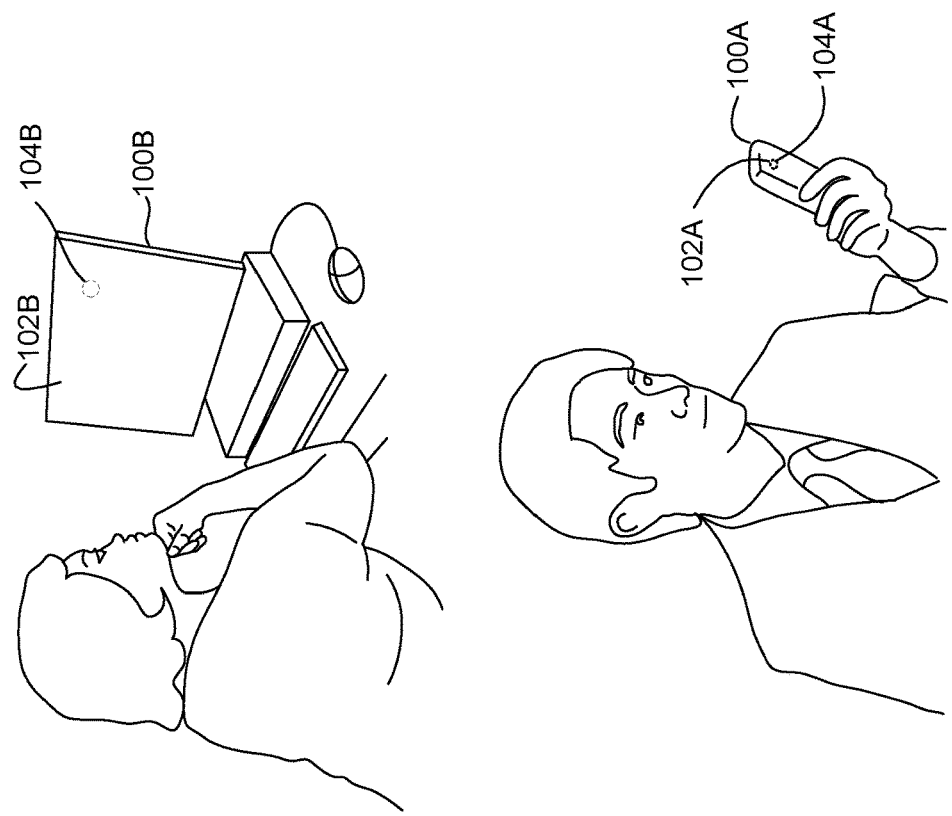
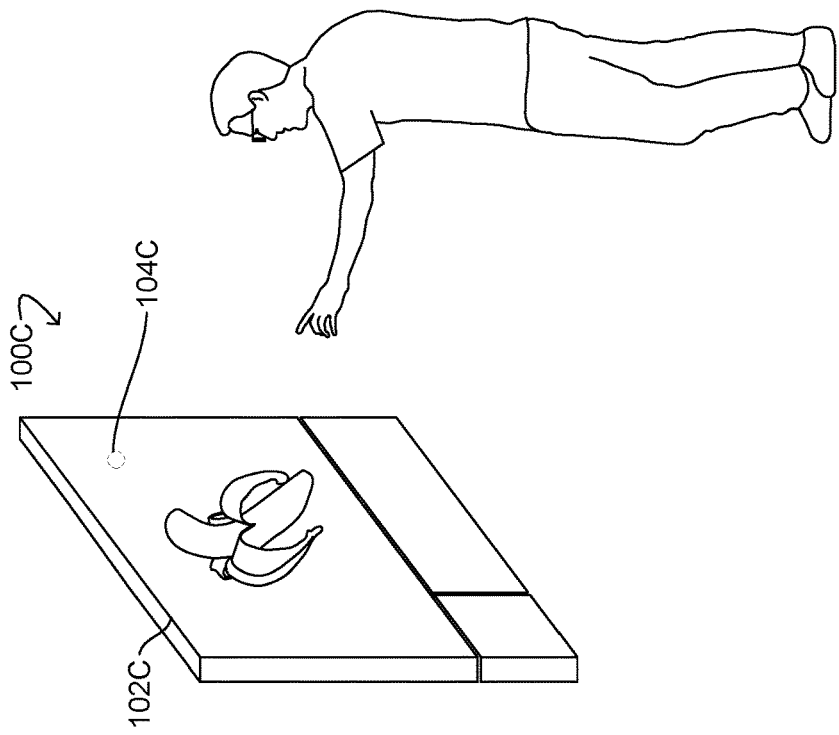
FIG. 1

SENSING AMBIENT LIGHT FROM BEHIND OLED DISPLAY

BACKGROUND

Display devices, such as smart phones, computer monitors, laptop computers, televisions, and tablets, often include a display bezel around a perimeter of a display portion of the device. Such bezels frequently serve as a location at which hardware devices, such as ambient light sensors, cameras, speakers, and microphones, are positioned.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to sensing ambient light through an organic light emitting diode (OLED) display. One example provides a method enacted on a display device comprising an OLED display panel and a light sensor positioned behind the OLED display panel with respect to a viewing surface of the OLED display panel. The method comprises receiving data samples from the light sensor and determining a temporal location for each of one or more non-emissive states of the OLED display panel. The method further comprises determining an ambient light characteristic using one or more data samples acquired during the one or more non-emissive states of the OLED display panel and adjusting an emission characteristic of the OLED display panel based at least in part on the ambient light characteristic determined.

Another example provides a display device comprising an organic light emitting diode (OLED) display panel, a light sensor positioned behind the OLED display panel with respect to a viewing surface of the OLED display panel, a processor, and storage comprising instructions executable by the processor to determine a temporal location for each of one or more emissive states of the OLED display panel and adjust each data sample received from the light sensor during the one or more emissive states using a corresponding value related to a light sensor response as a function of an OLED pixel emission to form an adjusted data sample. The instructions are further executable to determine an ambient light characteristic based at least in part on one or more of the adjusted data samples and adjust an emission characteristic of the OLED display panel based at least in part on the ambient light characteristic.

BRIEF DESCRIPTION OF THE DRAWINGS

FIG. 1 shows examples of display devices each comprising an ambient light sensor positioned behind an OLED display panel.

DETAILED DESCRIPTION

Figure 2:
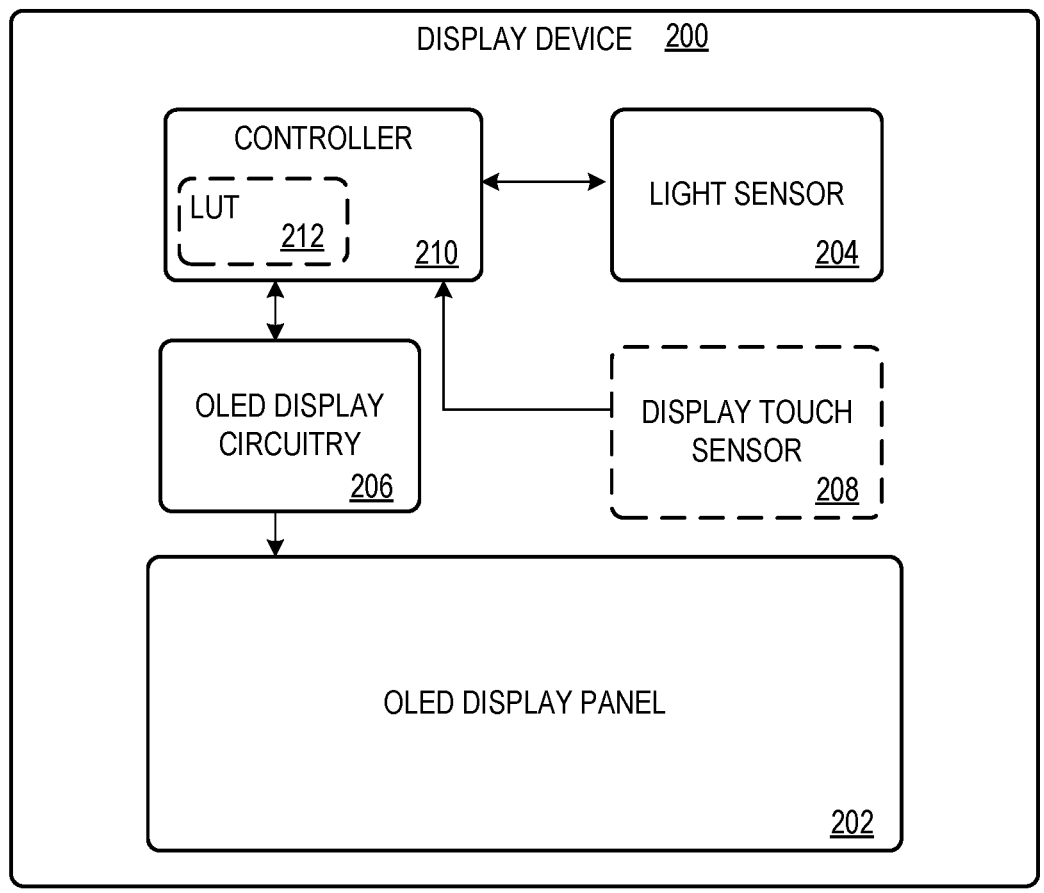
FIG. 2 shows a block diagram of an example display device.

As mentioned above, display bezels can be used to house hardware devices, such as sensors, in a display device. However, as consumer preferences move toward larger display areas on smaller devices, bezel widths continue to decrease, reducing the space available for such sensors. As a solution, hardware devices that cannot be made smaller to fit behind a smaller bezel are placed in other locations, such as at a perimeter side of a device. While such a location may be suitable for some hardware devices, such as speakers and microphones, it may not be as suitable for others, such as an ambient light sensor used to adjust a display brightness or color, as the ambient light sensed by the sensor in such a position may not be the same as the ambient light incident on the display.

One possible solution is to position an ambient light sensor behind the OLED display with respect to a viewing surface of the OLED display, such that the ambient light sensor senses ambient light through the OLED display panel. However, such a placement of a sensor can result in sensing of light emitted by pixels of the OLED display toward the ambient light sensor, in addition to ambient light. Such emission is referred to herein as back emission. Back emission contributes noise to the ambient light signal, thereby negatively impacting a signal-to-noise ratio of the ambient light sensor during OLED light emission. As an OLED display panel attenuates ambient light passing through the panel (light spectral transmission through the display panel to the light sensor can be on the order of 1-6%, depending upon display layers, materials, drive circuitry layout, and other factors, and is wavelength-dependent), noise from back emission further increases the difficulties of using a light sensor placed behind the display panel. Also, the back emitted light is variable over time with regard to color and intensity, as it depends upon the color and brightness of light being displayed. As such, any ambient light samples acquired during OLED display emission may be noisy and inaccurate, which in turn may cause errors in adjusting the display brightness and/or color based at least in part upon the ambient light signal.

Accordingly, examples are disclosed that relate to determining temporal locations of emissive and non-emissive states of an OLED display panel to facilitate ambient light sensing via a behind-display light sensor. Briefly, data from one or more sensors, such as a behind-display light sensor and/or a display touch sensor, are used to detect the temporal locations of emissive states of the OLED display panel during which back emission can impact ambient light sensing, and also non-emissive states during which back emission noise is reduced or not present. Such emissive and non-emissive states may occur in a regular pattern due, for example, to pulse width modulation (PWM) control of pixel brightness as well as a blanking pattern used by the OLED display panel, which depends on a refresh rate of the display (e.g. 20, 60, 90, 120 Hz). In this manner, on/off patterns of OLED display panel operation can be learned, and then used for timing of ambient light sensing so that ambient light is sensed during non-emissive states of the OLED display panel to determine an ambient light characteristic. Alternatively or additionally, in some examples, ambient light data samples acquired during emissive states can be adjusted to compensate for back emission. In such examples, information regarding OLED emission can be obtained from OLED display control circuitry (e.g. a display driver, a panel input, a graphics processing unit (GPU), and/or a system-on-a-chip (SoC)). OLED emission information may comprise information relating to the general OLED display or a local area of the OLED display (e.g. a region of interest in respect to the ambient light sensor).

FIG. 1 illustrates example display devices 100A, 100B, and 100C that can utilize an OLED display panel and a light sensor positioned behind the display panel. Display device 100A takes the form of a smartphone, and comprises a light sensor 104A located behind OLED display panel (which is user-facing here). Display device 100B takes the form of a monitor for a desktop computer having a light sensor 104B located behind OLED display panel 102B. Display device 100C is a television, and comprises a light sensor 104C behind OLED display panel 102C. Light sensors 104A, 104B, 104C can be configured to detect ambient light levels and/or ambient color intensity at one or more selected wavelength or wavelength bands. Further examples of display devices that can utilize a behind-display ambient light sensor include, but are not limited to, laptop computers, tablet computers, and kiosk-type devices. In some examples, a device may comprise more than one light sensor located behind a display.

FIG. 2 shows a schematic block diagram of an example display device 200 suitable for use as display devices 100A, 100B and 100C. Display device 200 comprises an OLED display panel 202, a light sensor 204 that is positioned physically behind the OLED display panel 202 with respect to a viewing surface of the OLED display panel, and an OLED display circuitry 206. OLED display circuitry 206 is configured to control the display of images by controlling emission of light by pixels of the OLED display panel 202, and may include any suitable circuitry, such as an OLED display controller. The emission of light by the pixels is temporally modulated (e.g. by PWM cycles and blanking times) and can be configured to emit different color intensities or brightness levels of light by appropriate control of the emissive OLED pixels, which can be controlled independently or in groups in various examples. In one example, blanking times are fixed over the OLED display panel 202, whereas PWM cycles vary in relation to an OLED display panel brightness and can be a rolling on/off pattern across the OLED display panel 202. In such an example, the blanking times are between frames of an image and each frame of the image is fixed, e.g. constant luminance and color for the frame.

In some examples, display device 200 further comprises an optional display touch sensor 208. Display touch sensor 208 can be mounted on the viewing surface of the OLED display panel 202 or integrated into the OLED display panel 202. In either case, a coupling can exist between the display touch sensor 208 and an electrode of the OLED display panel, which can result in signal crosstalk, also referred to herein as touch display noise. As described in more detail below, this crosstalk can be used to sense transitions between emissive and non-emissive states of the OLED display panel 202.

The display device 200 further comprises a controller 210 configured to control an operation of the light sensor 204 and optional display touch sensor 208, and to receive data samples from the light sensor 204 and display touch sensor 208. In some examples, as described in more detail below, the controller 210 further comprises a lookup table LUT 212 comprising values related to a response of the light sensor 204 as a function of an OLED pixel emission. The values stored in the optional lookup table 212 can be determined via a calibration procedure, in which light sensor samples are recorded for known OLED emissions in the absence of ambient light. Such values then may be used to adjust ambient light samples to correct for the effects of back emission, e.g. by subtracting lookup table values from measurements. The controller 206 can be implemented via a processor, a microprocessor, FPGA, ASIC, or other suitable logic computational machine.

Figure 3:
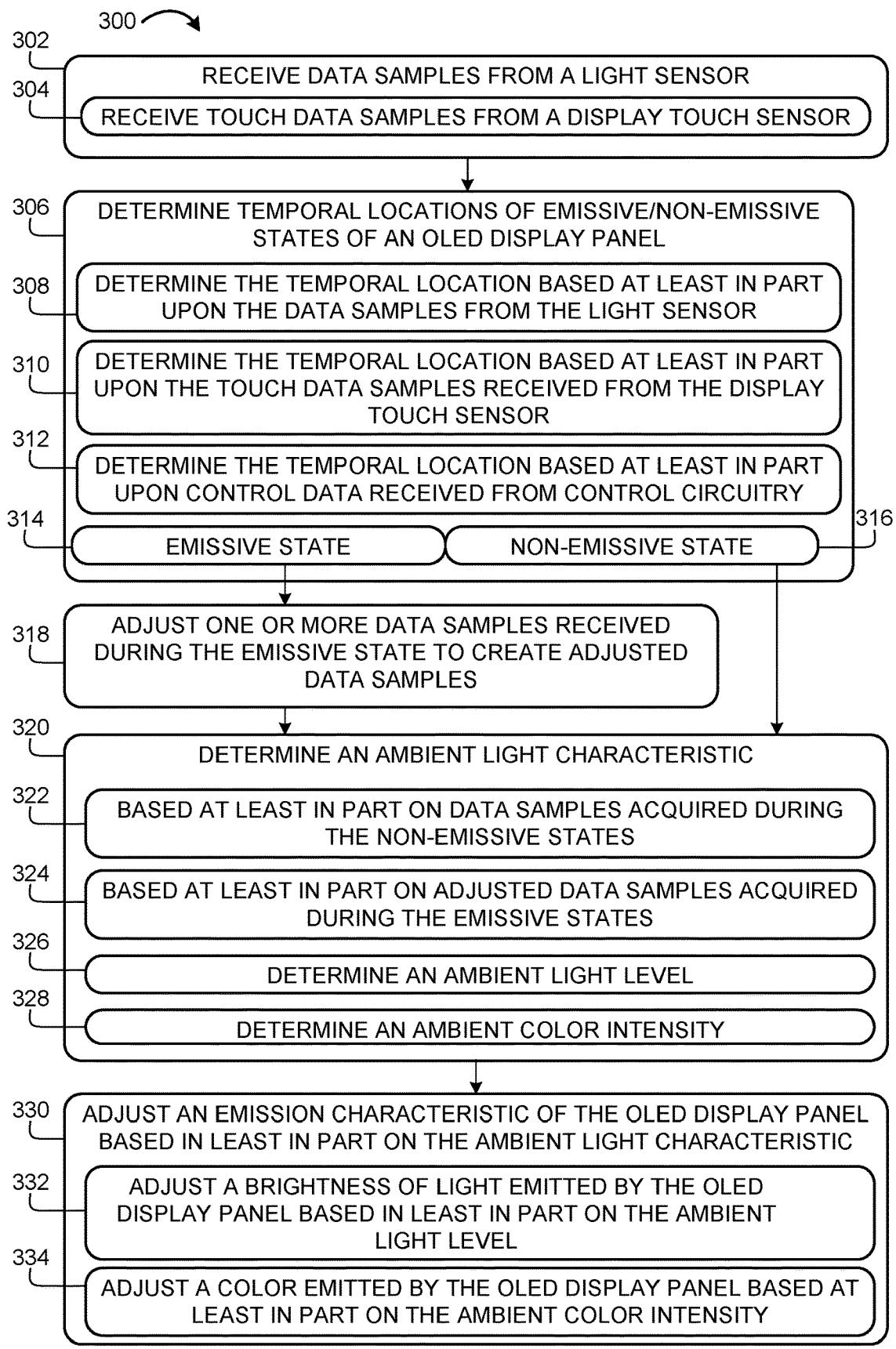
FIG. 3 shows a flow diagram depicting an example method of determining an ambient light characteristic using a light sensor positioned behind an OLED display panel.

FIG. 3 shows a flow diagram illustrating an example method 300 of sensing light via a light sensor positioned behind an OLED display panel with respect to a viewing surface of the OLED display panel. Method 300 can be implemented via any suitable OLED display device, including devices 100A-C in FIG. 1 as examples. Method 300 comprises, at 302, receiving data samples from the light sensor. The data samples may comprise any suitable information. For example, the data samples may comprise light intensity information for specific temporal locations. In some examples, the light intensity information may comprise color intensity information, e.g. from plural light sensors each with a different color filter to sense a different corresponding wavelength band of light. In display devices that comprise a display touch sensor positioned over or integrated with the OLED display panel, method 300 further comprises, at 304, receiving touch data samples from the display touch sensor.

At 306, method 300 comprises determining a temporal location of emissive and/or non-emissive states of the OLED display panel. Any suitable data may be used to determine the temporal location of the emissive and/or non-emissive states of the OLED display panel. For example, as indicated at 308, the temporal locations of the emissive and/or non-emissive states can be determined from light sensor data. This determination can be performed during manufacturing to detect patterns of emissive/non-emissive states, and/or during ordinary lifetime use to re-learn such patterns.

Figure 4:
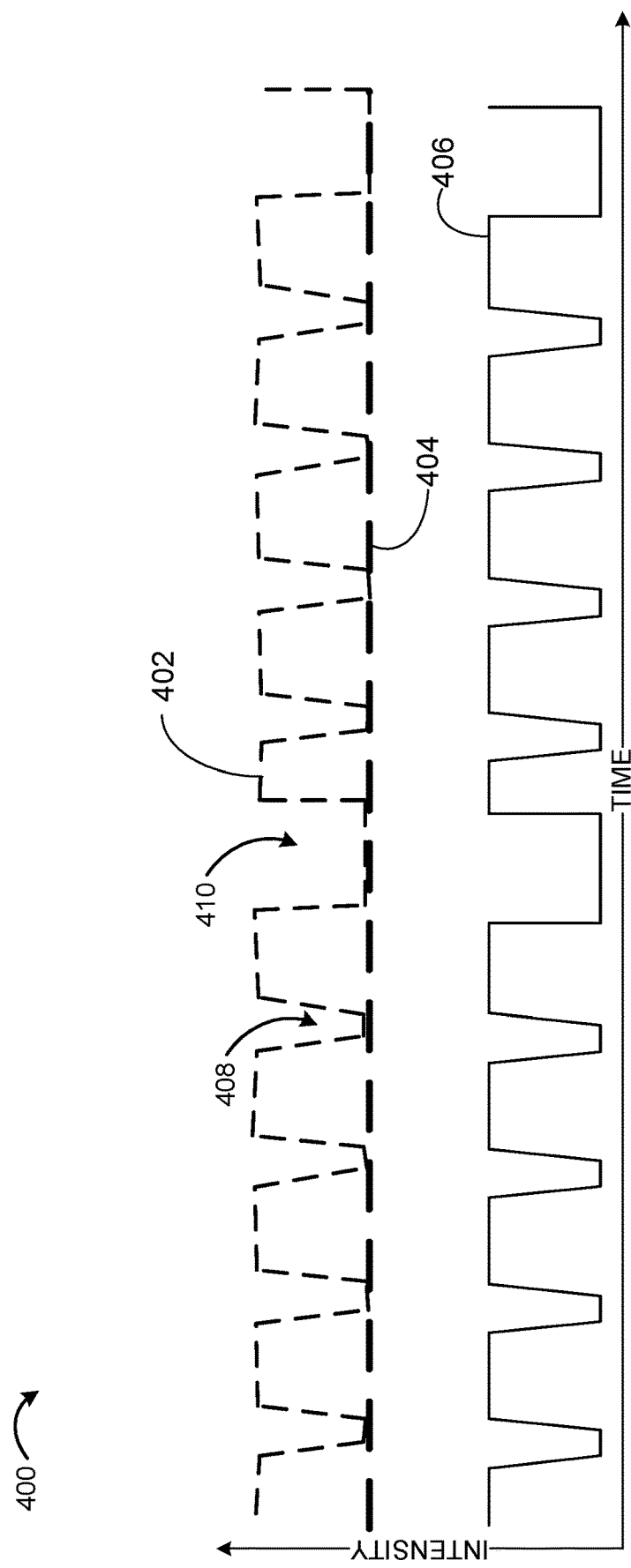
FIG. 4 schematically illustrates an example signal output by a behind-display light sensor over time, and illustrates ambient light and back emission components of the signal.

FIG. 4 shows a graph 400 depicting light sensing intensity as a function of time for an example behind-display light sensor. The sensed intensity as determined via data samples from the light is shown as line 402, the ambient component of the sensed intensity is shown at 404, and the back emission component of the sensed intensity is shown at 406.

Locations of higher sensed intensity correspond to ambient light plus display back emission and represent emissive periods of OLED display panel operation. Likewise, locations of lower sensed intensity correspond to ambient light only, and thus represent non-emissive periods. Such non-emissive periods include PWM non-emissive cycles 408 and blanking time 410. The width of PWM non-emissive cycles 408 is a function of display brightness. As examples, at full brightness, OLED pixels may be emissive approximately 80% of the time, and non-emissive 20% of the time. Likewise, at 50% brightness, the OLED pixels may be off approximately 60% of the time. As mentioned above, the timing of the blanking times 410 is a function of a refresh rate of an OLED display panel. Emissive/non-emissive patterns of an OLED display panel can be learned during production (e.g. by checking back emission level with different background and brightness levels), and/or adaptively learned and/or updated over device lifetime. In some examples, a status bar area (e.g. where clock, battery, connectivity, and/or other information may be displayed) of the OLED display panel can be sensed by the light sensor to learn emissive/non-emissive patterns of the OLED display panel, as a status bar may have predefined color definition per application which can be easily studied.

Figure 5:
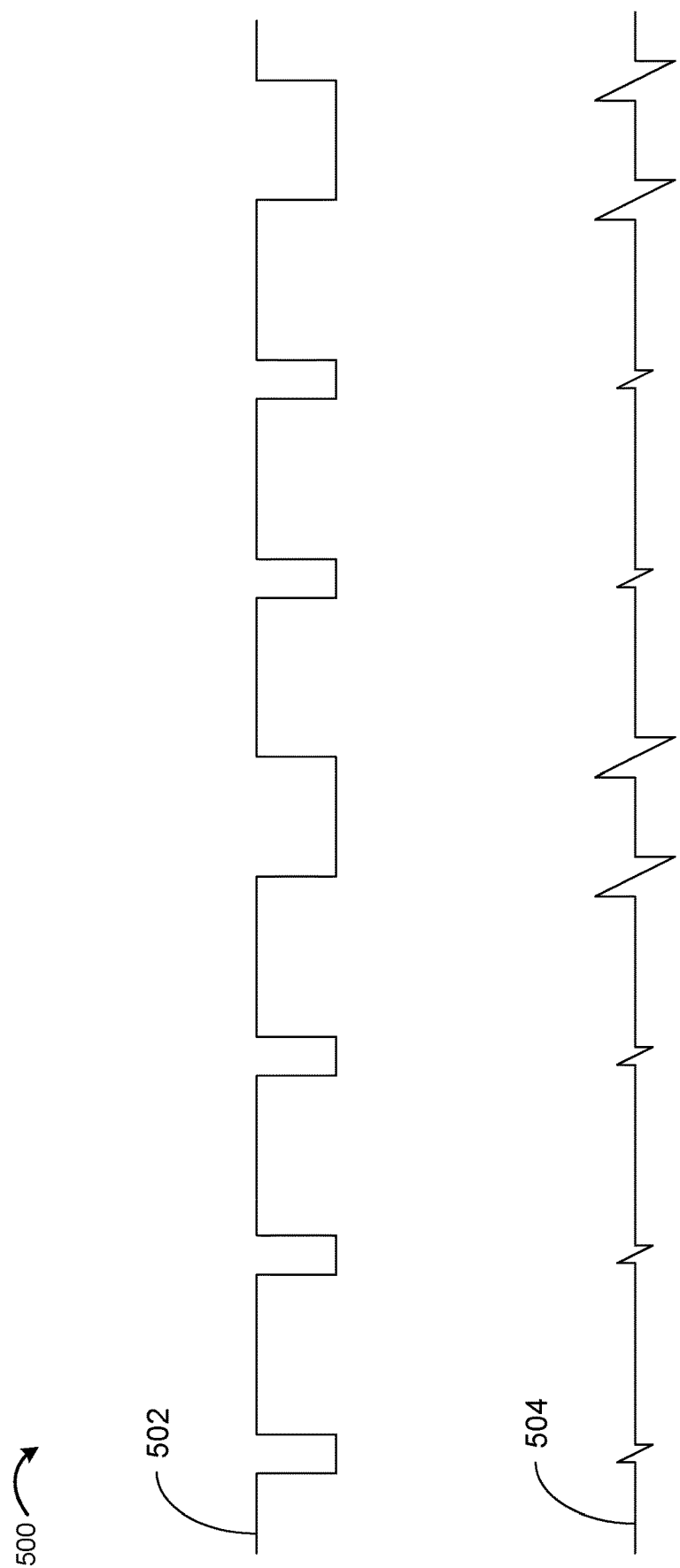
FIG. 5 schematically illustrates noise induced in a touch sensor by operation of an OLED display panel.

Returning to FIG. 3, in some examples, temporal locations of emissive and non-emissive states can alternatively or additionally be determined using data samples received from a display touch sensor, as indicated at 310. As mentioned above, the control of the OLED display panel can cause touch display noise resulting from coupling between the display touch sensor 204 and electrodes of the OLED display panel. FIG. 5 illustrates a touch data timing diagram 500 showing OLED display emission 502 and a touch sensor output 504 as a function of time. The touch display noise is illustrated schematically by touch data timing diagram 500 as noise located at transitions between emissive and non-emissive states of the OLED display. Thus, from the touch data timing diagram 500, the temporal locations of emissive and non-emissive states of an OLED display panel can be determined, potentially in combination with light sensor data to identify the OLED display state (emissive or non-emissive) between touch display noise events.

As mentioned above, in yet other example, the temporal location of the emissive/non-emissive states can be determined based at least in part upon control data, e.g. received from OLED display circuitry. The control data may comprise, for example, information related to an emission of light by pixels of the OLED display panel. Such information may comprise one or more of light intensity, color intensity, and temporal location of the emission of light of one or more pixels of the OLED display panel. As an example, the one or more pixels of the OLED display panel can be located within a light sensor opening. In some examples, a light sensor opening may be a diameter of approximately 2-3 mm, while an OLED display panel pixel-row is about 50 um in pitch. In such examples, approximately 40-60 pixel-rows may be seen by the light sensor. Thus, method 300, comprises, at 312, determining the temporal location of the emissive/non-emissive states based at least in part upon control data received from OLED display control circuitry.

As mentioned above, light sensor samples acquired during either or both of emissive states 314 and non-emissive 316 states can be used for determining an ambient light characteristic. Where non-emissive 316 states are used to determine the ambient light characteristic, the pixels within the light sensor opening in the non-emissive state. In such an example, light sensor exposures can be integrated over a plurality of individual samples that each is within a non-emissive state. As a more specific illustrative example, samples of approximately 0.2 milliseconds (ms) in duration can be acquired for each of sixty frames. In such an example, the ambient light characteristic may be estimated approximately once per second for a 60 Hz refresh rate.

Where emissive states 314 are used to determine an ambient light characteristic, method 300 comprises, at 318, adjusting one or more data samples received from the light sensor during the emissive states using a light sensor response as a function of an OLED pixel emission to create adjusted data samples. For example, as described above, data regarding the light sensor response as the function of OLED pixel emission can be stored in a lookup table (e.g. LUT 212). As such, this data can be referenced using information from OLED control circuitry regarding current OLED emission characteristics to adjust the data samples from the light sensor for back emission. As previously mentioned, lookup table LUT 212 can be created during a calibration procedure of an OLED display panel, in which back emission signals are recorded for various OLED emission patterns and intensities in the absence of ambient light. In other examples, instead of using a lookup table, display emission (brightness and/or color) can be calculated based upon a number of pixels that cover a field of view area of the light sensor, and then subtracting the calculated emission from the sensor measurement.

In some such examples, data samples can be acquired during both emissive and non-emissive states. As one more specific example, for a 60 Hz refresh rate, data samples can be acquired in 1 ms steps (1 ms integration followed by 1 ms non-integration). During the emissive state samples, light sensor noise and sensitivity to ambient light flicking can be determined and subtracted from the data sample to form adjusted data samples. As another more specific example, a longer light integration time can be acquired during emissive states than during non-emissive states. For example, a sample of 15.66 ms of emissive state data and a sample of 1 ms of non-emissive state data can be acquired for a 16.66 ms frame (60 Hz). This may provide more data per frame than sampling during non-emissive states alone, and thus provide a more accurate ambient light determination.

In some examples, ambient light sensor samples can be acquired using different sets of non-emissive periods depending upon OLED display panel operation state. For example, when the OLED emission brightness is in a relatively dimmer state, ambient light samples may be acquired during one or both of PWM cycles and blanking times, as the non-emissive periods of the PWM cycles are relatively longer. Likewise, when the OLED brightness is in a relatively brighter state, ambient light samples can be acquired during blanking times but not PWM cycles, as the non-emissive periods of the PWM cycles are relatively shorter.

Continuing, method 300 comprises, at 320, determining an ambient light characteristic. In some instances, the ambient light characteristic is determined based at least in part on the data samples acquired from the light sensor during the non-emissive states, as indicated at 322. In other examples, the ambient light characteristic alternatively or additionally is determined based at least in part on the adjusted data samples acquired from the light sensor during the emissive states, as indicated at 324. Any suitable ambient light characteristic can be determined, such as an ambient light level, as indicated at 326, and/or an ambient color intensity, at 328, using one or more color filters in front of a light sensor. Where an ambient color intensity is determined, a plurality of light sensors can be used, wherein each light sensor is configured to detect an intensity of a different color (e.g. red, green, and blue).

Continuing, method 300 comprises, at 330, adjusting an emission characteristic of the OLED display panel based at least in part on the ambient light characteristic. In some examples, method 300 may comprise adjusting a brightness of light emitted by the OLED display panel based at least in part on the ambient light level determined. In other examples, method 300 further comprises, at 334, adjusting a color of light emitted by the OLED display panel based at least in part on the ambient color intensity determined.

Method 300 can be implemented via hardware, software, firmware, or any combination therein. It is envisioned that method 300 can be implemented via a host device, a cloud system, or other logic computational machine or combination thereof. Method 300 may allow a computing device to adjust an OLED display emission characteristic more accurately to actual ambient light conditions by avoiding back emission noise when ambient light sensing. Further, the use of a lookup table in combination with pixel emission data from OLED display circuitry may allow for ambient light samples acquired during emissive states of an OLED display to be adjusted for back emission, thereby also mitigating noise from back emission.

In some examples, the methods and processes described herein may be tied to a computing system of one or more computing devices. In particular, such methods and processes may be implemented as a computer-application program or service, an application-programming interface (API), a library, and/or other computer-program product.

Figure 6:
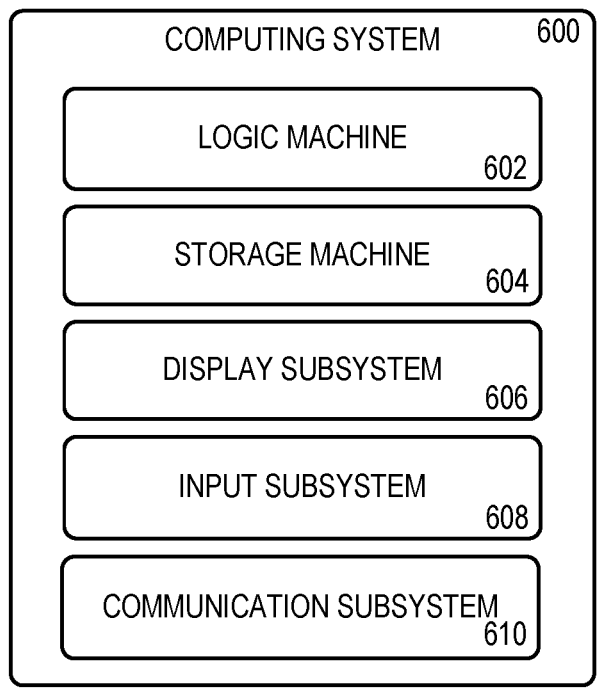
FIG. 6 shows a block diagram depicting an example computing device.

FIG. 6 schematically shows a non-limiting example of a computing system 600 that can enact one or more of the methods and processes described above. Computing system 600 is shown in simplified form. Computing system 600 may take the form of one or more personal computers, server computers, tablet computers, home-entertainment computers, network computing devices, gaming devices, mobile computing devices, mobile communication devices (e.g., smart phone), and/or other computing devices.

Computing system 600 includes a logic machine 602 and a storage machine 604. Computing system 600 may optionally include a display subsystem 606, input subsystem 608, communication subsystem 610, and/or other components not shown in FIG. 6.

Logic machine 602 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage machine 604 includes one or more physical devices configured to hold instructions executable by the logic machine to implement the methods and processes described herein. When such methods and processes are implemented, the state of storage machine 604 may be transformed—e.g., to hold different data.

Storage machine 604 may include removable and/or built-in devices. Storage machine 604 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 604 may include volatile, nonvolatile, dynamic, static, read/write, read-only, random-access, sequential-access, location-addressable, file-addressable, and/or content-addressable devices.

It will be appreciated that storage machine 604 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 602 and storage machine 604 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 600 implemented to perform a particular function. In some cases, a module, program, or engine may be instantiated via logic machine 602 executing instructions held by storage machine 604. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

It will be appreciated that a "service", as used herein, is an application program executable across multiple user sessions. A service may be available to one or more system components, programs, and/or other services. In some implementations, a service may run on one or more server-computing devices.

When included, display subsystem 606 may be used to present a visual representation of data held by storage machine 604. This visual representation may take the form of a graphical user interface (GUI). As the herein described methods and processes change the data held by the storage machine, and thus transform the state of the storage machine, the state of display subsystem 606 may likewise be transformed to visually represent changes in the underlying data. Display subsystem 606 may include one or more display devices utilizing virtually any type of technology. Such display devices may be combined with logic machine 602 and/or storage machine 604 in a shared enclosure, or such display devices may be peripheral display devices.

When included, input subsystem 608 may comprise or interface with one or more user-input devices such as a keyboard, mouse, touch screen, or game controller. In some examples, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 610 may be configured to communicatively couple computing system 600 with one or more other computing devices. Communication subsystem 610 may include wired and/or wireless communication devices compatible with one or more different communication protocols. As non-limiting examples, the communication subsystem may be configured for communication via a wireless telephone network, or a wired or wireless local- or wide-area network. In some examples, the communication subsystem may allow computing system 600 to send and/or receive messages to and/or from other devices via a network such as the Internet.

Another example provides a method enacted on a display device comprising an organic light emitting diode (OLED) display panel and a light sensor positioned behind the OLED display panel with respect to a viewing surface of the OLED display panel. The method comprises receiving data samples from the light sensor; determining a temporal location for each of one or more non-emissive states of the OLED display panel; determining an ambient light characteristic using one or more data samples acquired during the one or more non-emissive states of the OLED display panel; and adjusting an emission characteristic of the OLED display panel based at least in part on the ambient light characteristic determined. In some such examples, determining the temporal location for each of the one or more non-emissive states of the OLED display panel alternatively or additionally comprises determining the temporal location for each of the one or more non-emissive states from the data samples received from the light sensor. In some such examples, determining the temporal location for each of one or more non-emissive states of the OLED display panel alternatively or additionally comprises determining the temporal location for each of the one or more non-emissive states from control data received from OLED display control circuitry. In some such examples, determining the temporal location for each of the one or more non-emissive states of the OLED display panel alternatively or additionally comprises determining the temporal location for each of the one or more non-emissive states from touch data samples received from a display touch sensor. In some such examples, the ambient light characteristic alternatively or additionally comprises an ambient light level, and the emission characteristic of the OLED display panel alternatively or additionally comprises a brightness of light emitted by the OLED display panel. In some such examples, the ambient light characteristic alternatively or additionally comprises an ambient color intensity and the emission characteristic of the OLED display panel alternatively or additionally comprises a color emitted by the OLED display panel. In some such examples, the one or more non-emissive states alternately or additionally comprises one or more of a state within a pulse width modulated dimming pattern of the OLED display panel and a blanking time between image frames. In some such examples, the method alternatively or additionally comprises determining a temporal location for each of one or more emissive states of the OLED display panel, and adjusting each data sample received from the light sensor during the one or more emissive states using a corresponding value relating a light sensor response as a function of an OLED pixel emission to form an adjusted data sample, wherein determining the ambient light characteristic using one or more data samples acquired during the one or more non-emissive states of the OLED display panel alternatively or additionally comprises determining the ambient light characteristic also using one or more selected adjusted data samples.

Another example provides a display device, comprising an organic light emitting diode (OLED) display panel; a light sensor positioned behind the OLED display panel with respect to a viewing surface of the OLED display panel; a display touch sensor; a processor; and storage comprising instructions executable by the processor to receive touch data samples from the display touch sensor; from the touch data samples, determine a temporal location of each of one or more non-emissive states of the OLED display panel; determine an ambient light characteristic using one or more data samples from the light sensor acquired during the one or more non-emissive states of the OLED display panel; and adjust an emission characteristic of the OLED display panel based at least in part on the ambient light characteristic. In some such examples, the ambient light characteristic alternatively or additionally comprises an ambient light level and the emission characteristic of the OLED display panel may comprise a brightness of light emitted by the OLED display panel. In some such examples, the ambient light characteristic alternatively or additionally comprises an ambient color intensity and the emission characteristic of the OLED display panel alternatively or additionally comprises a color emitted by the OLED display panel. In some such examples, determining the temporal location alternatively or additionally comprises re-learning a pattern of non-emissive states during device use. In some such examples, the one or more non-emissive states of the OLED display panel alternatively or additionally comprises one or more of a blanking time between image frames and states within a pulse width modulated dimming pattern of the OLED display panel.

Yet another example provides a display device, comprising an organic light emitting diode (OLED) display panel; a light sensor positioned behind the OLED display panel with respect to a viewing surface of the OLED display panel; a processor; and storage comprising instructions executable by the processor to determine a temporal location for each of one or more emissive states of the OLED display panel; adjust each data sample received from the light sensor during the one or more emissive states using a corresponding value related to a light sensor response as a function of an OLED pixel emission to form an adjusted data sample; determine an ambient light characteristic based at least in part on one or more of the adjusted data samples; and adjust an emission characteristic of the OLED display panel based at least in part on the ambient light characteristic. In some such examples, the ambient light characteristic alternatively or additionally comprises an ambient light level and the emission characteristic of the OLED display panel alternatively or additionally comprises a brightness of light emitted by the OLED display panel. In some such examples, the ambient light characteristic alternatively or additionally comprises an ambient color intensity and the emission characteristic of the OLED display panel alternatively or additionally comprises a color emitted by the OLED display panel. In some such examples, the corresponding value alternatively or additionally is stored in a lookup table. In some such examples, the display device alternatively or additionally comprises OLED display control circuitry configured to control an emission of light by pixels of the OLED display panel, and wherein the instructions alternatively or additionally are executable to receive control data from the OLED display control circuitry and determine the corresponding value based at least in part upon the control data from the OLED display control circuitry. In some such examples, the control data alternatively or additionally comprises one or more of a local area of the OLED display panel, a color of pixel emission, and an intensity of pixel emission. In some such examples, the display device alternatively or additionally comprises a display touch sensor, the instructions may be alternatively or additionally executable to receive a plurality of touch data samples from the display touch sensor, and the instructions executable to determine the temporal location for each of the one or more emissive states of the OLED display panel alternatively or additionally comprise instructions executable to determine the temporal location of the one or more emissive states based at least in part on the plurality of touch data samples.

It will be understood that the configurations and/or approaches described herein are exemplary in nature, and that these specific examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A display device, comprising:
    an organic light emitting diode (OLED) display panel;
    a light sensor positioned behind the OLED display panel with respect to a viewing surface of the OLED display panel;
    a display touch sensor;
    a processor; and
    storage comprising instructions executable by the processor to
        receive touch data samples from the display touch sensor;
        from the touch data samples, learn a temporal pattern of non-emissive states of the OLED display panel, wherein the non-emissive states of the OLED display panel comprise one or more of a blanking time between image frames and states within a pulse width modulated dimming pattern of the OLED display panel;
        based at least upon learning the temporal pattern of the non-emissive states of the OLED display panel, determine an ambient light characteristic using one or more data samples from the light sensor acquired during one or more of the non-emissive states of the OLED display panel; and
        adjust an emission characteristic of the OLED display panel based at least in part on the ambient light characteristic.

2. The display device of claim 1, wherein the ambient light characteristic comprises an ambient light level and the emission characteristic of the OLED display panel comprises a brightness of light emitted by the OLED display panel.

3. The display device of claim 1, wherein the ambient light characteristic comprises an ambient color intensity and the emission characteristic of the OLED display panel comprises a color emitted by the OLED display panel.

4. The display device of claim 1, further comprising re-learning a pattern of non-emissive states during device use.

5. A display device, comprising:
    an organic light emitting diode (OLED) display panel;
    a light sensor positioned behind the OLED display panel with respect to a viewing surface of the OLED display panel;
    a processor; and
    storage comprising instructions executable by the processor to
        learn a temporal pattern of emissive states of the OLED display panel between non-emissive states of the OLED display panel, wherein the non-emissive states of the OLED display panel comprises one or more of a blanking time between image frames and states within a pulse width modulated dimming pattern of the OLED display panel;
        based at least upon learning the temporal pattern of the emissive states of the OLED display panel, adjust each data sample received from the light sensor during one or more of the emissive states using a corresponding value related to a light sensor response as a function of an OLED pixel emission to form an adjusted data sample;
        determine an ambient light characteristic based at least in part on one or more of the adjusted data samples; and
        adjust an emission characteristic of the OLED display panel based at least in part on the ambient light characteristic.

6. The display device of claim 5, wherein the ambient light characteristic comprises an ambient light level and the emission characteristic of the OLED display panel comprises a brightness of light emitted by the OLED display panel.

7. The display device of claim 5, wherein the ambient light characteristic comprises an ambient color intensity and the emission characteristic of the OLED display panel comprises a color emitted by the OLED display panel.

8. The display device of claim 5, wherein the corresponding value is stored in a lookup table.

9. The display device of claim 5, further comprising OLED display control circuitry configured to control an emission of light by pixels of the OLED display panel, and wherein the instructions are further executable to receive control data from the OLED display control circuitry and determine the corresponding value based at least in part upon the control data from the OLED display control circuitry.

10. The display device of claim 9, wherein the control data comprises one or more of a local area of the OLED display panel, a color of pixel emission, and an intensity of pixel emission.

11. The display device of claim 5,
    further comprising a display touch sensor;
    wherein the instructions are further executable to receive a plurality of touch data samples from the display touch sensor; and
    wherein the instructions executable to determine the temporal pattern of the emissive states of the OLED display panel further comprise instructions executable to determine the temporal pattern of the emissive states based at least in part on the plurality of touch data samples.

12. A method enacted on a display device comprising an organic light emitting diode (OLED) display panel and a light sensor positioned behind the OLED display panel with respect to a viewing surface of the OLED display panel, the method comprising:
    receiving data samples from the light sensor;
    learning a temporal pattern of non-emissive states of the OLED display panel, wherein the non-emissive states of the OLED display panel comprise one or more of a blanking time between image frames and states within a pulse width modulated dimming pattern of the OLED display panel;
    based at least upon learning the temporal pattern of the non-emissive states of the OLED display panel, determining an ambient light characteristic using one or more data samples acquired during one or more of the non-emissive states of the OLED display panel; and adjusting an emission characteristic of the OLED display panel based at least in part on the ambient light characteristic determined.

13. The method of claim 12, wherein determining the temporal pattern of the non-emissive states of the OLED display panel comprises determining the temporal pattern from the data samples received from the light sensor.

14. The method of claim 12, wherein determining the temporal pattern of the non-emissive states of the OLED display panel comprises determining the temporal pattern from control data received from OLED display control circuitry.

15. The method of claim 12, wherein determining the temporal pattern of the non-emissive states of the OLED display panel comprises determining the temporal pattern from touch data samples received from a display touch sensor.

16. The method of claim 12, wherein the ambient light characteristic comprises an ambient light level, and the emission characteristic of the OLED display panel comprises a brightness of light emitted by the OLED display panel.

17. The method of claim 12, wherein the ambient light characteristic comprises an ambient color intensity and the emission characteristic of the OLED display panel comprises a color emitted by the OLED display panel.

18. The method of claim 12, further comprising determining a temporal location for each of one or more emissive states of the OLED display panel, and adjusting each data sample received from the light sensor during the one or more emissive states using a corresponding value relating a light sensor response as a function of an OLED pixel emission to form an adjusted data sample; and wherein determining the ambient light characteristic using one or more data samples acquired during the one or more non-emissive states of the OLED display panel further comprises determining the ambient light characteristic also using one or more selected adjusted data samples.

* * * * *